United States Patent [19]

Okanobu

[11] Patent Number: 5,428,835
[45] Date of Patent: Jun. 27, 1995

[54] AM RECEIVER ON SEMI-CONDUCTOR WITH INTERNALLY GENERATED OSCILLATION SIGNAL REPRESENTING IF BAND PASS FILTER CENTER FREQUENCY DEVIATION

[75] Inventor: Taiwa Okanobu, Tokyo, Japan

[73] Assignee: Sony Corporation, Tokyo, Japan

[21] Appl. No.: 34,574

[22] Filed: Mar. 19, 1993

[30] Foreign Application Priority Data

Mar. 23, 1992 [JP] Japan ................... 4-095834

[51] Int. Cl.$^6$ .................. H04B 1/28; H03L 7/083; H04N 5/50
[52] U.S. Cl. .................... 455/310; 455/76; 455/260; 455/316; 455/318; 331/25; 331/36 C; 331/66; 348/735
[58] Field of Search .............. 455/296, 307, 316, 317, 455/318, 310, 76, 255, 257, 258, 259, 260; 331/14, 17, 16, 18, 25, 64, 36 C, 66; 348/735

[56] References Cited

U.S. PATENT DOCUMENTS 4,479,259 10/1984 Fenk ...................... 455/318
5,115,515 5/1992 Yamamoto et al. ............ 455/316

FOREIGN PATENT DOCUMENTS 0252072 1/1988 European Pat. Off. .
2488078 2/1982 France .
2933416 3/1981 Germany .

*Primary Examiner*—Edward F. Urban
*Assistant Examiner*—Mark D. Wisler
*Attorney, Agent, or Firm*—Jay H. Maioli

[57] ABSTRACT

A superheterodyne receiver has a receiver circuit formed into a single semiconductor chip comprising a pseudo band-pass filter employing components equivalent to those of an intermediate-frequency filter of the receiver circuit and an oscillation circuit employing the pseudo band-pass filter as a feedback path thereof.

The oscillation circuit oscillates at a frequency equal in value to the center frequency of the intermediate-frequency filter. The semiconductor chip is further equipped with a PLL circuit allowing the frequency-division ratio of a variable frequency-divider circuit to be varied in order to control a reception frequency, and the oscillation frequency of the oscillation circuit is monitored. Data representing the reception frequency is derived from the monitored oscillation frequency and the value of the frequency-division ratio of the variable frequency-divider circuit, and then output to a display element to display the reception frequency.

1 Claim, 6 Drawing Sheets

|  | | NORMAL VALUE | ERROR VALUE | COMPENSATED VALUE | |
|---|---|---|---|---|---|
| BPF | $f_{17}$ | 55 kHz | 50 kHz | 50 kHz | $f_{17}(=f_1)$ |
| LOCAL OSCILLATION | $2f_o$ | 2110 kHz | 2110 kHz | 2110 kHz | $2f_o$ |
| RECEPTION | $f_r$ | 1000 kHz | 1005 kHz | 1005 kHz | $f_r = f_o - f_{17}$ |
| N | | 1055 | 1055 | 1055 | $f_o$ |
| OFFSET | | −55 | −55 | −50 | $-f_{17}$ |
| DISPLAYED FREQUENCY | | 1000 kHz | 1000 kHz | 1005 kHz | $f_r$ |

AM RECEIVER ON SEMI-CONDUCTOR WITH INTERNALLY GENERATED OSCILLATION SIGNAL REPRESENTING IF BAND PASS FILTER CENTER FREQUENCY DEVIATION

BACKGROUND OF THE INVENTION

1. Field of the Invention

The present invention relates to a superheterodyne radio receiver adopting a PLL synthesizer technique.

2. Description of the Related Art

When integrating a radio receiver adopting a superheterodyne technique into a single-chip IC, using a ceramic filter as an intemediate-frequency filter makes it impossible to build the intermediate-frequency filter into a single monolithic IC.

Therefore, configuring an intemediate-frequency filter as an active filter comprising resistors, capacitors and an operational amplifier has been taken into consideration. With such an active filter, however, setting the intermediate frequency to the standard value of 450 kHz will make the area of the semiconductor chip of the IC occupied by the active filter large and, hence, undesirable.

As another alternative, the intermediate frequency is lowered to a value of typically 55 kHz, a value considered to be sufficiently lower than those of frequencies in the reception band, in order to solve the above problem.

A typical radio receiver and a typical IC employed therein are shown in FIG. 5. A portion 10 enclosed by a dotted dashed line in the figure is a monolithic IC for a single-chip AM receiver. Notations T1 to T8 are its external pins. The pin T3 is a power-supply pin whereas the pin T4 is a ground pin.

Components outside the dotted dashed line are parts or circuits. Reference numeral 1 denotes an antenna tuning circuit and reference numeral 2 is a resonance circuit for exciting local oscillation. The antenna tuning circuit 1 further comprises a bar antenna (antenna tuning coil) L1 and a variable capacitor VC1 while the resonance circuit 2 comprises a local oscillation coil L2 and a variable capacitor VC2 which is interlocked with the variable capacitor VC1.

In addition to the components cited above, the radio receiver further comprises a power-supply switch SW, a power-supply battery BATT having a voltage of typically 3 V, a variable resistor VR for volume adjustment and a speaker SP.

The antenna tuning circuit 1 selects and extracts a broadcast-wave signal Sr which is expressed by the following equation:

$$Sr = Er \cdot \sin \omega r \, t$$

where $\omega r = 2\pi fr$

Thereafter, the signal Sr is processed by the radio receiver. In the processing of an incoming signal, only relative relations of amplitude and phases are of interest. Therefore, the initial phase of each signal is omitted from the above equation and the following description.

The signal Sr is then supplied to a high-frequency amplifier 11 through the pin T1 of the IC 10. The signal Sr amplified by the high-frequency amplifier 11 is subsequently output to first and second mixer circuits 12A and 12B.

Connected to the resonance circuit 2 through the pin T2, a local-oscillation circuit 13 generates a local-oscillation signal So. The oscillation frequency of the oscillation signal So has a value of 2fo which is given by the following equation:

$$2fo = (fr + fi) \times 2 \, [\text{kHz}] \quad (1)$$

where fi is an intermediate frequency having a value of typically 55 kHz.

The local-oscillation signal So is supplied to a frequency-divider circuit 14 where it is split into different local-oscillation signals Soa and Sob each having a frequency equal to half the frequency of the local-oscillation signal So. The difference in phase between the local-oscillation signals Soa and Sob is 90 degrees. The local-oscillation signals Soa and Sob are expressed as follows:

$$Soa = Eo \cdot \cos \omega o \, t$$

$$Sob = Eo \cdot \sin \omega o \, t$$

where $\omega o = 2\pi fo$

The local-oscillation signals Soa and Sob are multiplied by the broadcast-wave signal Sr and then supplied to the first and second mixer circuits 12A and 12B respectively to result in signals Sia and Sib as follows:

$$\begin{aligned} Sia &= Sr \cdot Soa \\ &= Er \cdot \sin \omega r \, t \cdot Eo \cdot \cos \omega o \, t \\ &= \alpha \{\sin(\omega r + \omega o)t + \sin(\omega r - \omega o)t\} \\ Sib &= Sr \cdot Sob \\ &= Er \cdot \sin \omega r \, t \cdot Eo \cdot \sin \omega o \, t \\ &= \alpha \{-\cos(\omega r + \omega o)t + \cos(\omega r - \omega o)t\} \\ \alpha &= Er \cdot Eo / 2 \end{aligned}$$

Signal components having a frequency of $(\omega r + \omega o)$ are eliminated from the signals Sia and Sib while those with a frequency of $(\omega r - \omega o)$ are used as an intermediate-frequency signal as will be described later. Elimination of the signal components having a frequency of $(\omega r + \omega o)$ yields the intermediate-frequency signals as follows:

$$Sia = \alpha \cdot \sin(\omega r - \omega o) \, t$$

$$Sib = \alpha \cdot \cos(\omega r - \omega o) \, t$$

Here, let an image signal Sm be given by the following equation:

$$Sm = Em \cdot \sin \omega m \, t$$

where $\omega m = \omega o + \omega i$ $\omega i = 2\pi fi$

Since the broadcast-wave signal Sr from the tuning circuit 1 conveys the image signal Sm, the signals Sia and Sib can then be expressed as follows:

$$Sia = \alpha \cdot \sin(\omega r - \omega o) \, t + \beta \cdot \sin(\omega m - \omega o) \, t$$

$$Sib = \alpha \cdot \cos(\omega r - \omega o) \, t + \beta \cdot \cos(\omega m - \omega o) \, t$$

where $\beta = Em \cdot Eo / 2$

In addition, since the relation $\omega r < \omega o < \omega m$ holds true, the above two equations can be rewritten into the following:

$$Sia = \alpha \cdot \sin(\omega r - \omega o)t + \beta \cdot \sin(\omega m - \omega o)t$$
$$= -\alpha \cdot \sin(\omega o - \omega r)t + \beta \cdot \sin(\omega m - \omega o)t$$
$$Sib = \alpha \cdot \cos(\omega r - \omega o)t + \beta \cdot \cos(\omega m - \omega o)t$$
$$= \alpha \cdot \cos(\omega o - \omega r)t + \beta \cdot \cos(\omega m - \omega o)t$$

These signals Sia and Sib are supplied to first and second phase-shifting circuits 15A and 15B respectively. The first and second phase-shifting circuits 15A and 15B are each an active filter which typically comprises capacitors, resistors and an operational amplifier. The first phase-shifting circuit 15A shifts the phase of the signal Sia by $\phi$ degrees whereas the second phase-shifting circuit 15B shifts the phase of the signal Sib by ($\phi$+90) degrees. Accordingly, in the band 45 to 65 kHz, the difference in phase between the two shifted signals Sia and Sib is in the range 89 to 91 degrees.

In this way, the first and second phase-shifting circuits 15A and 15B cause the phase of the signal Sib to lead ahead of that of the signal Sia as expressed by the following equations:

$$Sia = -\alpha \cdot \sin(\omega o - \omega r)t + \beta \cdot \sin(\omega m - \omega o)t$$
$$Sib = \alpha \cdot \cos\{(\omega o - \omega r)t + 90°\} +$$
$$\beta \cdot \cos\{(\omega m - \omega o)t + 90°\}$$
$$= -\alpha \cdot \sin(\omega o - \omega r)t - \beta \cdot \sin(\omega m - \omega o)t$$

The shifted signals Sia and Sib are summed up by an adder 16 to give a total signal Si as follows:

$$Si = Sia + Sib$$
$$= -\alpha \cdot \sin(\omega o - \omega r)t + \beta \cdot \sin(\omega m - \omega o)t +$$
$$\{-\alpha \cdot \sin(\omega o - \omega r)t - \beta \cdot \sin(\omega m - \omega o)t\}$$
$$= -2\alpha \cdot \sin(\omega o - \omega r)t$$
$$\text{where } \omega o - \omega r = 2\pi(fo - fr)$$
$$= 2\pi fi$$

It is thus seen that the signal Si given above is the desired intermediate-frequency signal. It is also obvious from the above equation that signal components caused by the image signal Sm are eliminated from the intermediate-frequency signal Si even if the broadcast-wave signal Sr from the tuning circuit 1 includes the image signal Sm.

In this way, the signal Si converted from the broadcast-wave signal Sr (as well as a signal component having an angular frequency of ($\omega r + \omega o$) and the like) can be extracted from the adder 16.

The intermediate-frequency signal Si is then supplied to a band-pass filter 17 which serves as an intermediate-frequency filter. As shown in FIG. 7, the band-pass filter 17 is typically a biquad-type active filter that comprises capacitor C11 and C12, resistors R11 to R16 and inverting amplifiers A11 to A13. The band-pass filter 17 has a passing center frequency f17 of 55 kHz and a passing bandwidth of 6 to 8 kHz. The band-pass filter 17 removes unnecessary signal components, leaving only the intermediate-frequency signal Si.

The intermediate-frequency signal Si output by the band-pass filter 17 is then supplied to an AM-wave detecting circuit 22 through an amplifier 21 to give an audio signal Ss (and a direct-current component V22 at a level corresponding to that of the intermediate-frequency signal Si). Subsequently, the audio signal Ss is fed to an audio amplifier 23 having differential inputs before being supplied to the speaker SP through the pin T8 and a capaciters C5.

The signal Sib coming from the second mixer 12B is fed to an AGC-voltage forming circuit 18 to produce an AGC voltage which is supplied to the amplifier 11 as a signal controlling the gain thereof. The amplifier 11 thereby carries out automatic gain control on the signals Sia and Sib. It should be noted that the AGC-voltage forming circuit 18 is connected to a condenser C3 for smoothing the AGC voltage through the pin T5. The AGC voltage is also fed to the operational amplifiers of the first and second shifting circuits 15A and 15B as well as the operational amplifier of the band-pass filter 17 as a reference voltage.

The detection output of the AM-wave detecting circuit 22 is supplied to the AGC-voltage forming circuit 24 to produce an AGC voltage which is fed to the amplifiers 11 and 21 as a signal controlling the gains thereof. The amplifiers 11 and 21 thereby perform automatic gain control on the intermediate-frequency signals Sia, Sib and Si.

The AGC-voltage forming circuit 24 is connected to a capacitor C4 for smoothing the AGC voltage through the pin T6. The capacitor C4 serves as a low-pass filter for producing a direct-current voltage V22 from the detection output. The AGC voltage is, in fact, generated from the direct-current voltage V22. In addition, the direct-current voltage V22 is also fed to one of the differential inputs of the amplifier 23. In this way the direct-current voltage V22, in effect, neutralizes the direct-current component V22 which is supplied to the other differential input of the amplifier 23 along with the audio signal Ss from the AM-wave detecting circuit 22.

The amplifier 23 is also connected to the variable resistor VR through the pin T7. The resistance value of the variable resistor VR is changed to control the gain of the amplifier 23. The variable resistor VR is thus used for adjusting the volume.

It should be noted that a capacitor C6 is used for by-passing signal components other than the audio signal Ss. 0026

In this IC 10, the intermediate frequency fi is a frequency having a value sufficiently lower than that of the ordinary intermediate frequency and those of frequencies in the reception band. Accordingly, the area occupied by each stage of the band-pass filter (intermediate-frequency filter) 17 is large. However, the number of stages for obtaining a required selectivity characteristic can be reduced. As a result, the total area on the IC 10 occupied by the band-pass filter 17 can be made smaller, justifying the integration of the circuits into an IC chip described above.

Reference numeral 30 shown in the figure is a PLL circuit. A local-oscillation signal So obtained from the resonance circuit 2 is supplied to a variable frequency-divider circuit 32 through an amplifier The variable frequency-divider circuit 32 outputs a signal S32 with a frequency 1/N times that of the local-oscillation signal So. The signal S32 is supplied to one of inputs of a phase comparing circuit 33. An oscillation signal S34 output by an oscillation circuit 34 at a reference frequency of 2 kHz is fed to the other input of the phase comparing circuit 33. A signal output by the phase comparing circuit 33 is supplied to the variable-capacitance diodes VC11 and VC12 through a low-pass filter 35 and buffer resistors R31 and R32 as their control voltages.

At a steady state, the frequency of the frequency-division signal S32 is equal to that of the oscillation frequency S34 which has a value of 2 kHz. Accordingly, the oscillation frequency 2fo of the local-oscillation signal So is given by the following equation.

$$2fo = 2 \cdot N \text{ [kHz]} \qquad (1)$$

By the way, the oscillation frequency 2fo is expressed by Eq. (2) as follows.

$$2fo = (fr + fi) \times 2 \text{ [kHz]} \qquad (2)$$

From Eqs. (1) and (2), it can be stated that the following relation holds true.

$$(fr + fi) \times 2 = 2 \cdot N$$

Modifying the above equation results in the following.

$$fr + fi = N$$

Accordingly, $$\therefore fr = N - fi , \qquad (3)$$

where the frequencies fr and fi are expressed in terms of kHz.

By changing the frequency-division ratio N of the frequency-divider circuit 32 in units of unity across the range typically from 586 to 1666, the oscillation frequency 2fo of the local-oscillation signal So changes in 2-kHz units in the range 1172 to 3332 kHz. Accordingly, the reception frequency fr changes in 1 kHz-units across the range 531 to 1611 kHz. As an alternative, the frequency-division ratio N can be changed in units of 9 to give a reception frequency fr changing in 9-kHz units.

Reference numeral 40 shown in FIG. 6 denotes a microcomputer for controlling the system whereas reference numeral 51 is a variety of operation keys. Reference numeral 52 denotes display devices such as LCDs. A desired reception frequency fr can be specified via the operation keys 51. The specified reception frequency fr is converted by the microcomputer 40 into a frequency-division ratio N which is then set into the frequency-division circuit 32. In this way, a broadcast station having a frequency fr can be selected by manipulating the operation keys 51.

At the same time, the microprocessor 40 further forms numerical data (N−fi) from the frequency-division ratio N to represent the reception frequency fr in terms of kHz in accordance with Eq. (3). The numerical data (N−fi) is then converted into character data for displaying the reception frequency fr. The character data is finally supplied to the LCDs 52 where the reception frequency fr is displayed in digital form.

As described above, the band-pass filter 17 of the IC 10 is typically configured as a biquad-type active filter as shown in FIG. 7 with a center frequency 17 of 55 kHz. The center frequency f17 is, by the way, determined by a product of values of the capacitors C11 and C12 and the resistors R11 to R16 which constitute the band-pass filter 17.

In general, however, it is impossible to create a capacitor or a resistor in an IC with a high degree of accuracy. That is to say, errors of the order of 5% and 20% are resulted in for a capacitor and a resistor respectively. In the case of the band-pass filter 17 shown in FIG. 7, the value of the center frequency f17 thus has an error of the order of 25% or varies across the range f17−14 to f17+14 kHz.

In the case of the IC 10, the center frequency f17 of the band-pass filter 17 becomes an actual intermediate frequency fi. Accordingly, when the center frequency f17 of the band-pass filter 17 deviates from a nominal value of 55 kHz due to the errors described above, a discrepancy between the actual reception frequency fr and the displayed frequency value is resulted in.

Here, let the local-oscillation frequency fo be 2110 kHz. In the case of a center frequency f17 of the band-pass filter 17 equal to a normal value of 55 kHz, the reception frequency fr and the frequency-division ratio N are found from Eqs. (1) and (3) to be 1000 kHz and 1055 respectively as shown in the second column of FIG. 4.

The microcomputer 40 further subtracts the intermediate frequency fi having a correct value of 55 from the frequency-division ratio N having a value of 1055 in accordance with Eq. (3), with all quantities in the subtraction expressed in terms of kHz, to give a result of 1000. The subtraction result having a value of 1000 is converted into character data which is then supplied to the LCDs 52. A value of 1000 kHz is finally displayed by the LCDs 52 in digital form to represent the reception frequency fr.

In the above case, the reception frequency fr and the frequency value displayed on the LCDs 52 match each other with both having a value of 1000 kHz. Therefore, no problems are encountered whatsoever.

The third column of FIG. 4, however, shows a case in which the center frequency f17 of the band-pass filter 17 deviates from the normal value to a value of, say, 50 kHz. In this case, the reception frequency fr and the frequency-division ratio N are found from Eqs. (1) and (3) to be 1005 kHz and 1055 respectively as shown in the third column of FIG. 4. That is to say, the reception frequency fr changes but the frequency-division ration N does not.

The microcomputer 40 further subtracts the intermediate frequency fi having a correct value of 55 from the frequency-division ratio N having a value of 1055 in accordance with Eq. (3) to give a result of 1000 with all quantities in the subtraction expressed in terms of kHz. The subtraction result having a value of 1000 is converted into character data which is then supplied to the LCDs 52. A value of 1000 kHz is finally displayed by the LCDs 52 in digital form to represent the reception frequency fr.

In this case, the reception frequency fr thus does not agree with the frequency value displayed on the LCDs 52 with the former having a value of 1005 kHz while the latter having a value of 1000 kHz.

As described above, if the center frequency f17 of the band-pass filter 17 deviates from the normal value, there is a discrepancy between the reception frequency fr and the frequency value displayed on the LCDs 52. To be more specific, if the center frequency f17 of the band-pass filter 17 deviates from the normal value by Δf, the frequency value displayed on the LCDs 52 is smaller than the reception frequency fr by the frequency deviation Δf, where Δf = Frequency deviation of the center frequency f17 of the band-pass filter 17 from the normal value Normal value—f17 (where the normal value is 55 kHz)

In other words, the reception frequency fr is larger than the frequency value displayed on the LCDs 52 by the frequency deviation Δf.

In general, the passing bandwidth of the intermediate-frequency filter (the band-pass filter 17) is 6 to 8 kHz with the frequency of the medium-wave broadcast taken as the center of the band. In this case, permissible values of the frequency deviation of the tuned frequency (reception frequency fr) are of the order of 1 to 1.5 kHz.

As described above, however, the frequency deviation Δf of the center frequency f17 of the band-pass filter f17 is in the range 0 to a value of the order of 14 kHz in both the negative and positive directions. The frequency deviation Δf appears as it is as a shifted amount of frequency Δf of the reception frequency fr relative to the frequency value displayed on the LCDs 52. Accordingly, the frequency deviation Δf of the reception frequency fr relative to the frequency value displayed on the LCDs 52 exceeds the permissible values of the order of 1 to 1.5 kHz.

Selecting a broadcasting station in accordance with a frequency displayed on the LCDs 52 may thus result in an untuned state with a frequency deviation exceeding the permissible limit, giving rise to reproduced sound that is very difficult to hear. In other words, an operation to tune the radio receiver while listening to reproduced sound may result in a displayed frequency value deviating from the reception frequency fr.

In the case of an IC 10 with resonance circuits 1 and 2 connected thereto employing variable capaciters VC1 and VC2 as shown in FIG. 5 the reception frequency fr is displayed by means of a dial needle which is interlocked with the variable condensers VC1 and VC2 as well as a tuning button. Accordingly, the dial needle cannot display the reception frequency fr with a sufficiently high degree of accuracy. In actuality, the dial needle is therefore generally used only for roughly adjusting the radio receiver to a reception frequency fr and fine tuning is then performed by listening to the reproduced sound. In this way, no serious problem is encountered even if the displayed frequency value deviates from the reception frequency fr.

With the radio receiver adopting the PLL synthesizer technique as shown in FIG. 6, however, the reception frequency fr can be displayed with a sufficiently high degree of accuracy. Therefore, a discrepancy between the reception frequency fr and the displayed frequency value is regarded as an unacceptable problem which remains to be solved.

OBJECT AND SUMMARY OF THE INVENTION

Assume that the local-oscillation frequency 2fo is 1000 kHz and the center frequency f17 of the band-pass filter 17 deviates from a normal value of 55 kHz to a value of, say, 50 kHz as shown in the thin column of FIG. 4. In this case, the reception frequency fr and the frequency-division ratio N are found from Eqs. (1) and (3) to be 1005 kHz and 1055 respectively as shown in the third column of FIG. 4.

If a value of 50 is subtracted from the frequency-division ratio N having a value of 1055 by the microcomputer 40, however, the result is 1005 which is equal in value to the reception frequency fr which is also 1005.

It should be noted that, in general, the center frequency of the band-pass filter 17 is equal in value to the frequency f17 as shown in the fifth column of FIG. 4. In this case, the reception frequency and the frequency-division ratio are found from Eqs. (1) and (3) to be the frequency value fo−f17 and the value N respectively as also shown in the fifth column of FIG. 4.

That is to say, the center frequency f17 of the band-pass filter 17 becomes equal in value to the intermediate frequency fi as expressed by the following equation:

$$fi = f17$$

By expressing the frequencies fr, fo, fi and f17 in terms of kHz, the following is derived from Eq. (3):

$$fr = N - fi \qquad (4)$$
$$= N - f17$$

It is obvious from Eq. (4) that subtracting the value f17 expressed in terms of kHz from the frequency-division ratio N gives the value fr. When expressed in terms of kHz, the value fr is equal to the reception frequency fr.

Making use of the above relation, the present invention detects the center frequency f17 of the band-pass filter 17, providing an offset based on the detected center frequency f17 to the frequency-division ratio N in order to calculate data used for displaying the reception frequency fr.

The same reference numerals are used in drawings of embodiments to be described later for denoting components having corresponding functions to those shown in the figures given so far. The present invention provides a single semiconductor chip IC 10 comprising at least a band-pass filter 17 serving as an intermediate-frequency filter, a pseudo band-pass filter 27 comprising components equivalent to those of the band-pass filter 17 and an oscillation circuit 25, wherein the pseudo band-pass filter 27 serves as a feedback path of the oscillation circuit 25 and the oscillation circuit 25 oscillates at a frequency equal in value to the center frequency of the band-pass filter 17.

The IC 10 is further equipped with a PLL variable frequency-division circuit 32 for dividing the local-oscillation frequency of a local-oscillation signal output by a local-oscillation circuit 13, a phase comparing circuit 33 for comparing the phase of the frequency-division output of the PLL variable frequency-division circuit 32 to that of a reference signal, a low-pass filter 35 for filtering a comparison result output by the phase comparing circuit 33 and a display element 52 for displaying a reception frequency.

A PLL circuit 30 is formed by supplying the output of the low-pass filter 35 to the local-oscillation circuit 13 as a signal for control the local-oscillation frequency thereof. The frequency-division ratio the PLL variable frequency-division circuit 32 is varied in order to control the reception frequency, and the oscillation frequency of the oscillation circuit 25 is monitored. Data representing the reception frequency is derived from the monitored oscillation frequency and the value of the frequency-division ratio of the PLL variable frequency-division circuit 32, and then output to the display element 52 to display the reception frequency.

According to one aspect of the present invention there is provided a superheterodyne receiver adopting a PLL synthesizer method, wherein:

at least part of a receiver circuit of said superheterodyne receiver is created in a semiconductor chip;

a band-pass filter circuit serving as an intermediate-frequency filter is created in said semiconductor chip;

a pseudo band-pass filter circuit comprising components equivalent to elements employed in said band-pass filter is created; and an oscillation circuit employing said pseudo band-pass filter circuit as a feedback path thereof oscillates at a frequency equal in value to m times a center frequency of said intermediate-frequency band-pass filter circuit, where m is an integer including the number 1.

According to another aspect to the present invention there is provided a superheterodyne receiver comprising:

a single semiconductor chip embedding at least a mixer circuit, a local-oscillation circuit for generating a local-oscillation signal, a band-pass filter circuit serving as an intermediate-frequency filter, a wave detecting circuit, a pseudo band-pass filter circuit employing components equivalent to elements of said intermediate-frequency band-pass filter and an oscillation circuit employing said pseudo band-pass filter circuit as a feedback path thereof and oscillating at an oscillation frequency equal in value to a center frequency of said intermediate-frequency band-pass filter;

a variable frequency-division circuit for dividing a local-oscillation frequency of said local-oscillation signal output by said local-oscillation circuit;

a phase-comparing circuit for comparing the phase of a divided frequency output of said variable frequency-divider circuit to the phase of a reference signal output by a reference oscillation circuit;

a low-pass filter for filtering a comparison result output by said phase-comparing circuit; and a display element for displaying a reception frequency, wherein:

a PLL circuit is formed by supplying an output of said low-pass filter to said local-oscillation circuit as a signal for controlling said local-oscillation frequency thereof;

a frequency-division ratio of said variable frequency-divider circuit is varied in order to control said reception frequency;

said oscillation frequency of said oscillation circuit is monitored; and data representing said reception frequency is derived from said monitored oscillation frequency and said frequency-division ratio of said variable frequency-divider circuit and then output to said display element in order to display said reception frequency.

BRIEF DESCRIPTION OF THE DRAWINGS

FIG. 4 is a table showing relations between the reception frequency fr and the displayed frequency value;

DETAILED DESCRIPTION OF THE PREFERRED EMBODIMENTS

Figure 1:
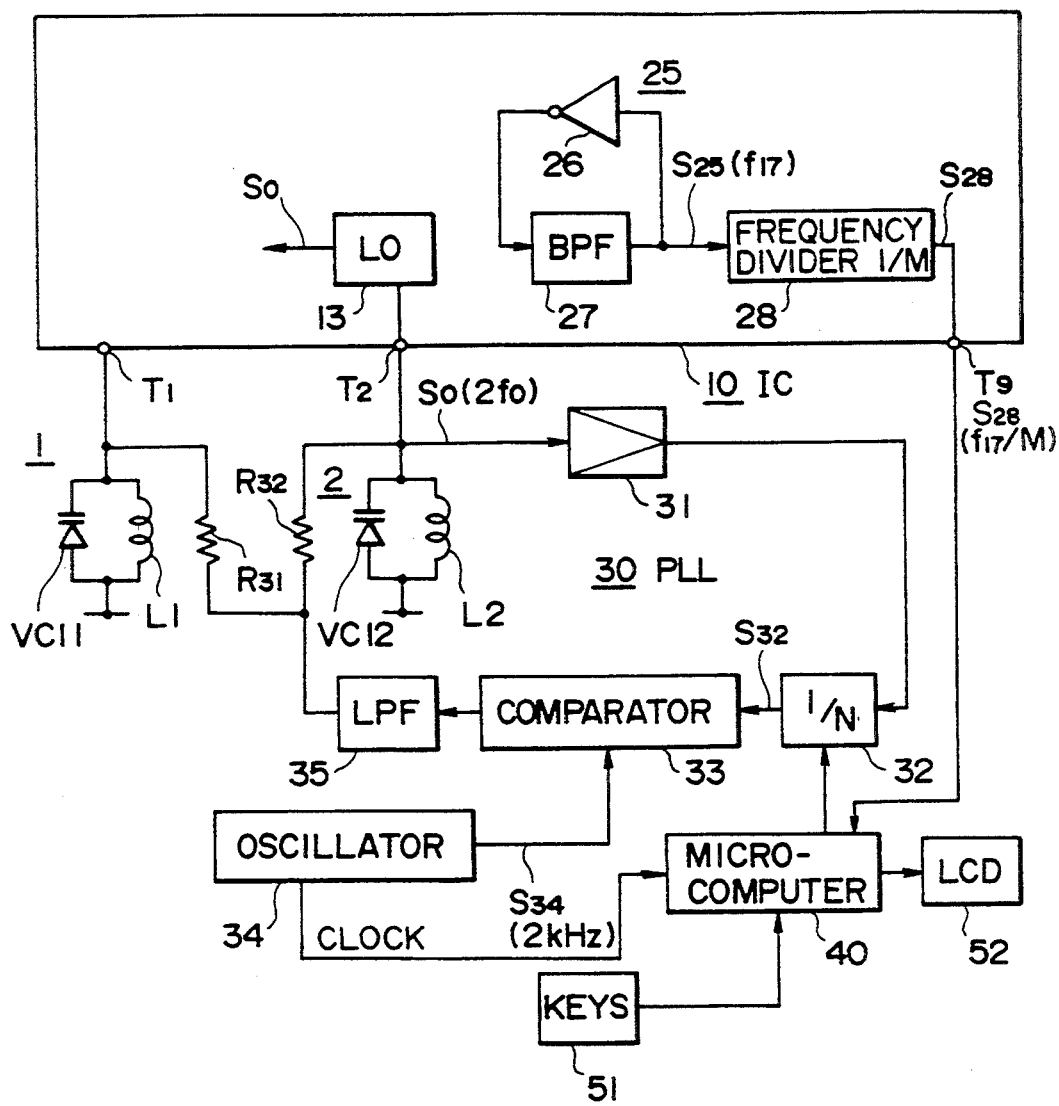
FIG. 1 is a system diagram showing an embodiment implementing a receiver circuit apparatus in accordance with the present invention.
Figure 5:
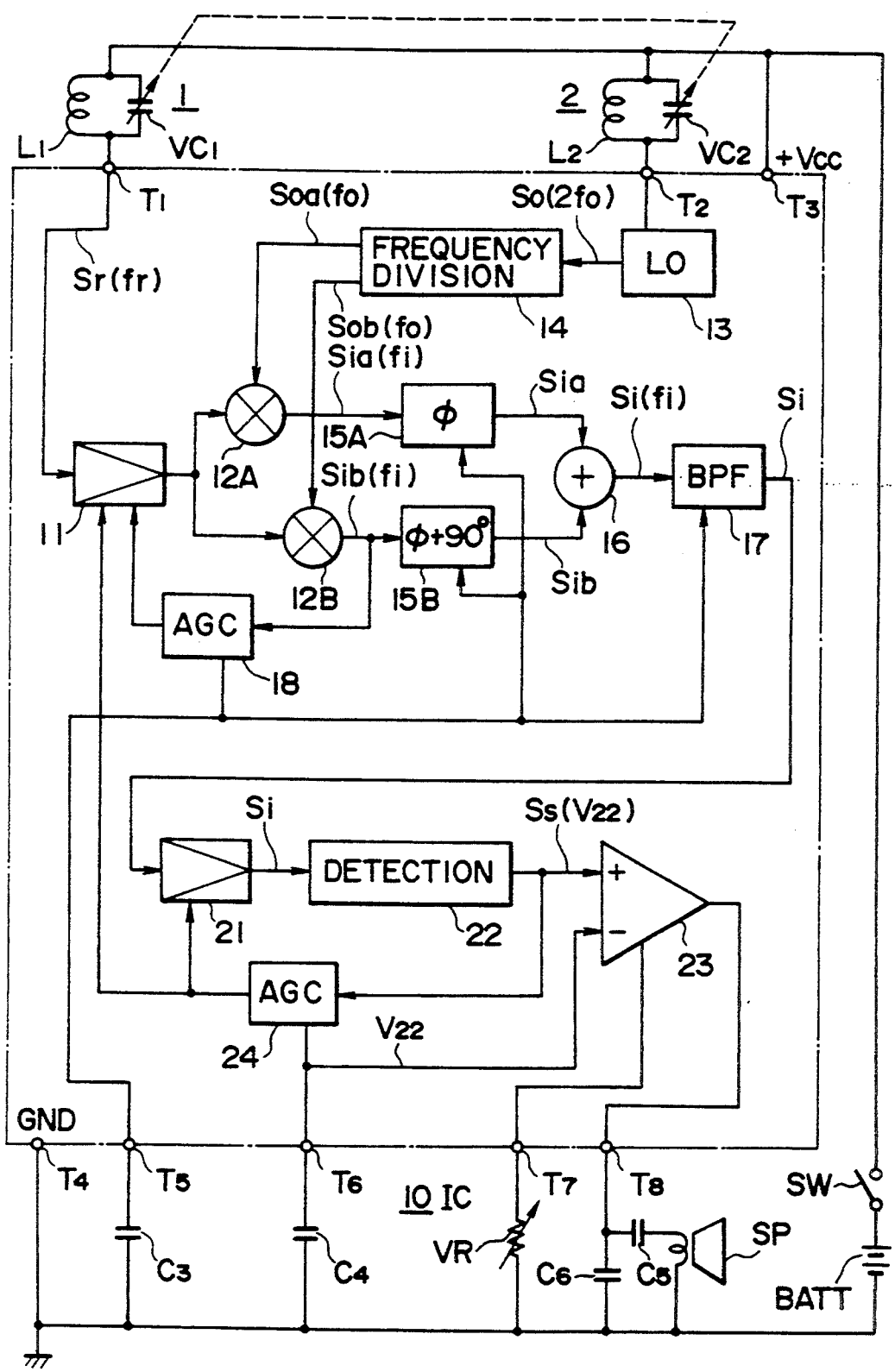
FIG. 5 is a system diagram showing a typical application of a single-chip IC to a radio receiver.
Figure 6:
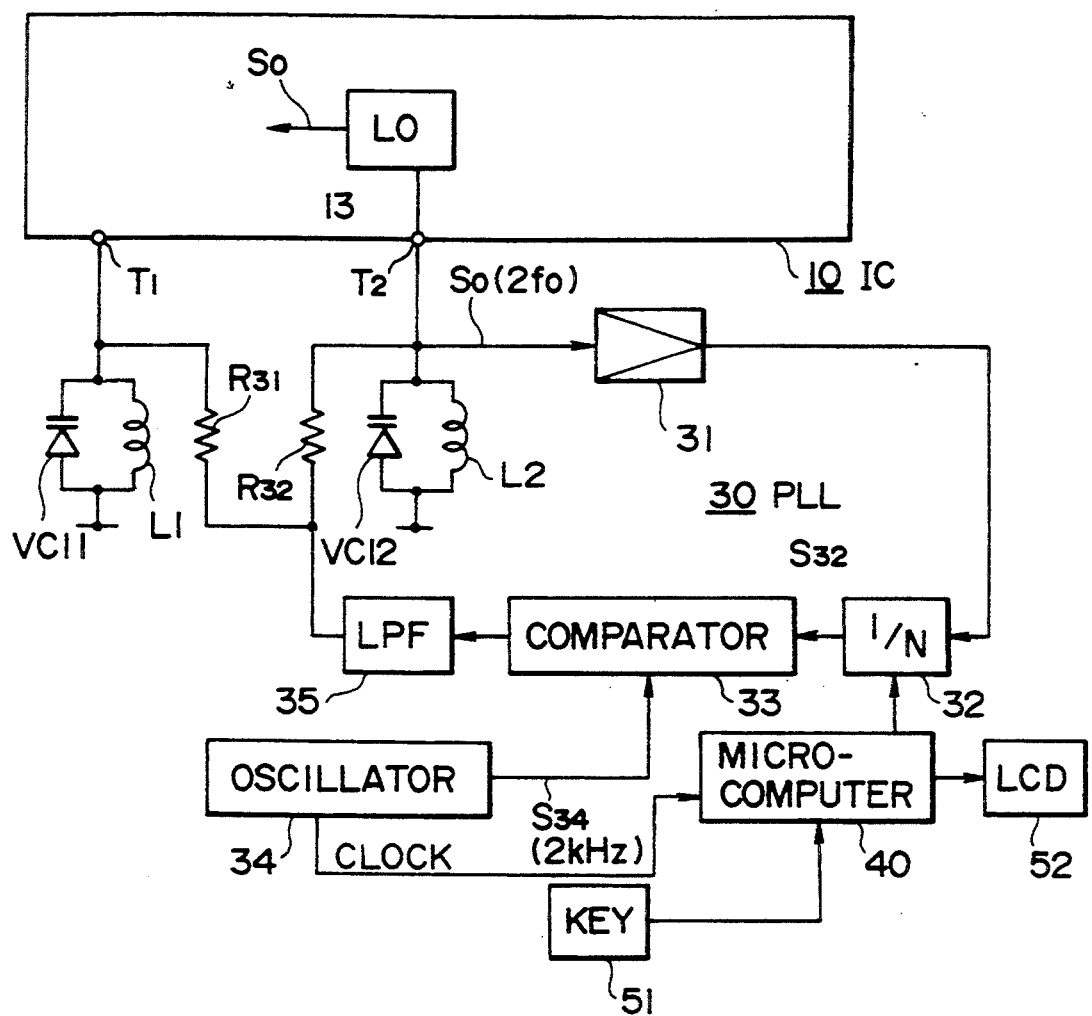
FIG. 6 is a system diagram showing another typical application of the single-chip IC shown in FIG. 5 to a radio receiver.

As shown for example in FIGS. 1 and 5 a band-pass filter 17 serving as an intermediate frequency filter and a pseudo band-pass filter 27 having the same passing characteristic as the band-pass filter 17 are created in an IC 10. The pseudo band-pass filter 27 and a phase-inverting amplifier 26 connected thereto form an oscillation circuit 25. An oscillation signal S25 produced by the oscillation circuit 25 is supplied to a frequency divider 28. The number of cycles of the divided oscillation signal S28 is counted by the microcomputer 40. The counted data are used as an offset when computing character data for displaying a reception frequency fr from a frequency-division ratio N.

It should be noted that the pseudo band-pass filter 27 is created in the semiconductor IC chip 10 containing other reception circuits using a semiconductor monolithic manufacturing process in the same way and at the same time as the band-pass filter 17. It is needless to say that the phase-inverting amplifier 26 and the frequency divider 28 are also created in the same chip and in the same way as the psudo band-pass filter 27 and the band-pass filter 17.

Figure 2:
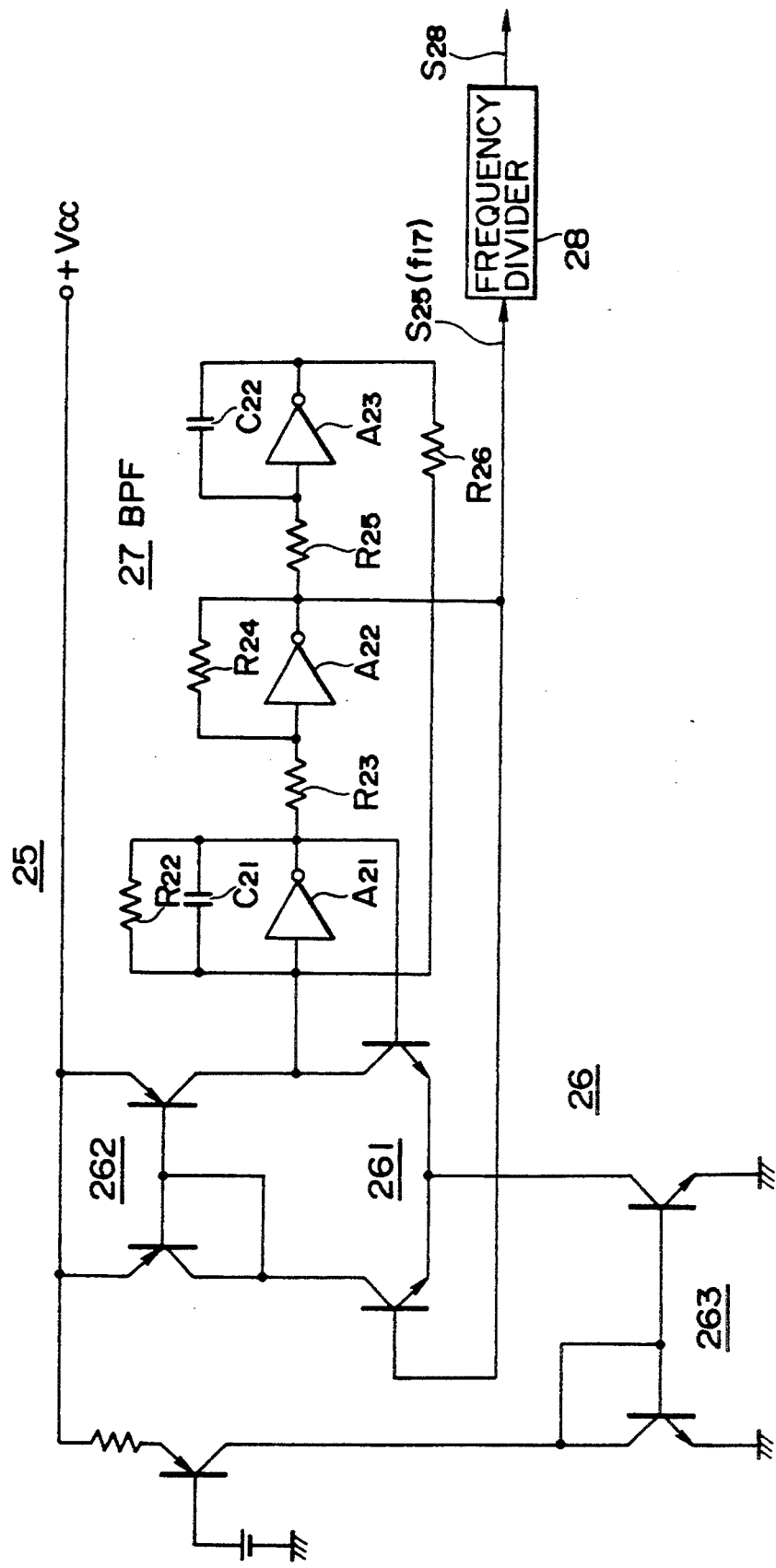
FIG. 2 shows an oscillation circuit employed in the embodiment shown in FIG. 1.
Figure 7:
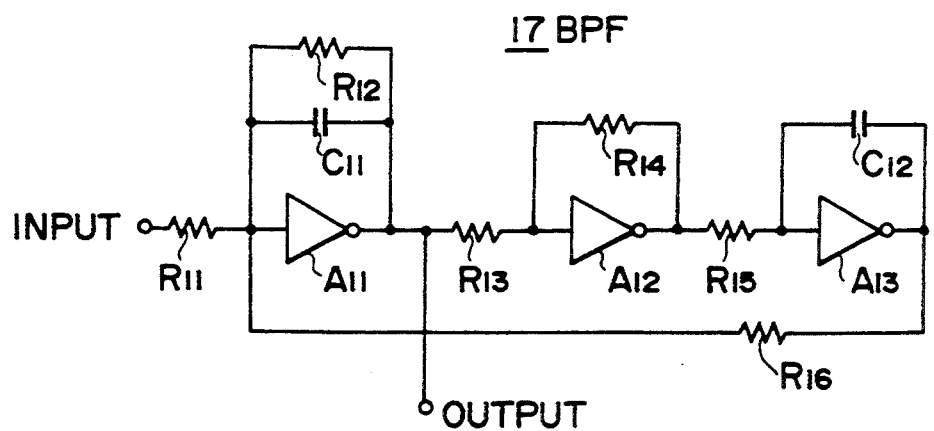
FIG. 7 is a connection diagram of a typical portion of the single-chip IC for a radio receiver shown in FIG. 5.

A typical pseudo band-pass filter 27 and a typical phase-inverting amplifier 26 are shown in FIG. 2. As shown in the figure, the pseudo band-pass filter 27 comprises capacitors C21 and C22, resistors R22 to R26 and inverting amplifiers A21 to A23. Much like the band-pass filter 17 shown in FIG. 7, the pseudo band-pass filter 27 is configured into a biquad-type active filter. The phase-inverting amplifier 26, on the other hand, comprises a differential amplifier 261, an output current mirror circuit 262 and another current mirror circuit 263 which serves as a constant-current supply.

The outputs of the amplifiers A21 and A22 employed by the pseudo band-pass filter 27 are supplied to the differential amplifier 261 and the outputs of the differential amplifier 261 and the current mirror circuit 262 are fed to the amplifier A21 so as to form the oscillation circuit 25. The output of the amplifier A22 is obtained as an oscillation signal S25.

In this configuration, the pseudo band-pass filter 27 is created at the same time, forming the same configuration as the band-pass filter 17 into the IC 10 as described earlier. Accordingly, the pseudo band-pass filter 27 has a center frequency equal in value to the center frequency f17 of the band-pass filter 17. As a result, when the center frequency f17 of the band-pass filter 17 deviates from the normal value, that of the pseudo band-pass filter 27 also deviates as well.

The pseudo band-pass filter 27 and the phase-inverting amplifier 26 connected thereto form the oscillation circuit 25. The oscillation circuit 25 thus oscillates at a frequency equal in value to the center frequency f17 of the pseudo band-pass filter 27. That is to say, the frequency of the oscillation signal S25 is equal in value to the center frequency 17 of the band-pass filter 17.

The oscillation signal S25 produced by the oscillation circuit 25 is supplied to the frequency divider 28. The number of cycles of the divided signal S28 is counted by the microcomputer 40. The divided signal S28 thus represents the center frequency f17 of the signal S25 expressed in terms of kHz and the value f17 expressed in terms of kHz is equal to the value f17 of Eq. (4).

The microcomputer 40 then subtracts the value f17 expressed in terms of kHz from the frequency-division ratio N to give a result of N−f17. Subsequently, the subtraction result N−f17 is converts into character data which is finally supplied to the LCDs 52.

In this way, the LCDs 52 display the character data having a value of N−f17 in a digital form to represent the reception frequency. As indicated by Eq. (4), the value N−f17 is not other than a broadcasting reception frequency fr expressed in terms of kHz. Accordingly, the reception frequency fr is always correctly displayed in a digital form on the LCDs 52 even if the center frequency f17 of the band-pass filter 17 deviates from the normal value.

According to the present invention, the center frequency f17 of the band-pass filter 17 is monitored and the frequency-division ratio N used in the calculation of the displayed frequency value is compensated as described above. Accordingly, no discrepancy results in between the reception frequency fr and the displayed frequency value even if the center frequency f17 of the band-pass filter 17 deviates from the normal value.

As a result, transmission from a desired broadcasting station can be normally received without a tuning error even if the broadcasting station is selected in accordance with a frequency displayed on the LCDs 52.

In addition, the value N−f17 displayed to represent the reception frequency fr is always obtained from the values N and f17. Accordingly, it is not necessary to adjust compensation of the displayed frequency value even if the center frequency f17 of the band-pass filter 17 is shifted during the process of manufacturing the receiver circuit. At the same time, no discrepancy results in between the reception frequency fr and the displayed frequency value even if the center frequency f17 of the band-pass filter 17 deviates from the normal value due to environmental changes such as variations in temperature.

An IC 10 was prototyped and a receiver circuit was built by using the prototype of the IC 10. Experiment results indicate that discrepancies between the reception frequency fr and the displayed frequency value are in the range −500 to +500 Hz, fully satisfying the permissible values of 1 to 1.5 kHz given above.

Figure 3:
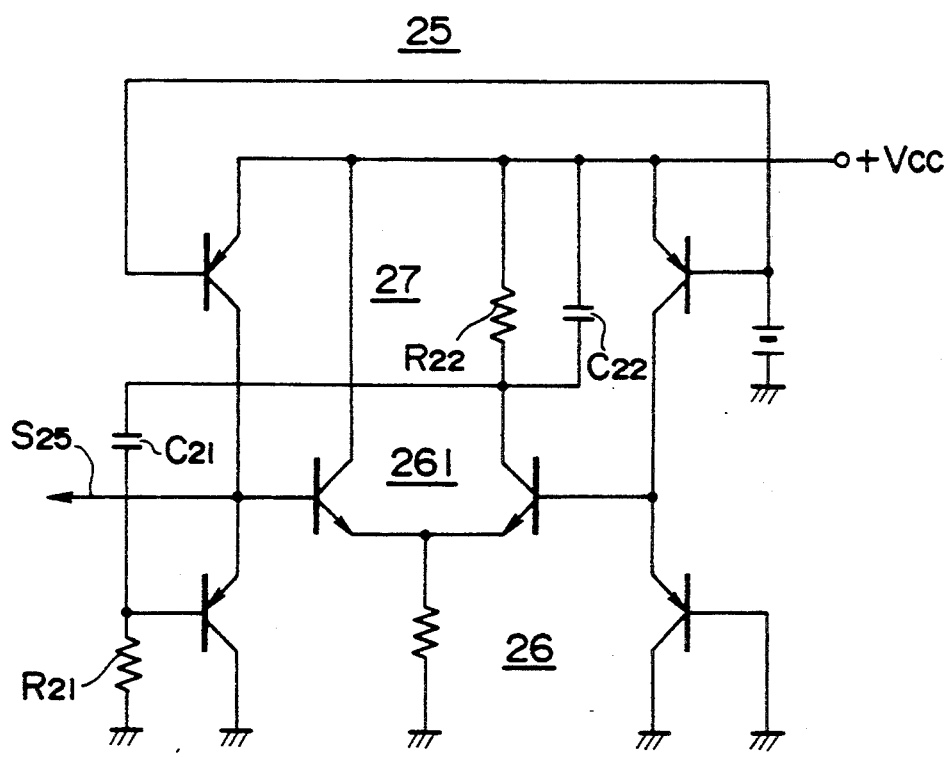
FIG. 3 shows a simplified oscillation circuit employed in the embodiment shown in FIG. 1.

A simplified typical oscillation circuit 25 is shown in FIG. 3. As shown in the figure, a positive-feedbak circuit of the differential amplifier 261 comprises capacitors C21 and C22 as well as resistors R21 and R22 to form the oscillation circuit 25.

As described earlier, the value N−f17 for use in displaying the reception frequency fr is always obtained from the frequency-division ratio N and the center frequency f17. At power-on, for example, the value f17 is obtained either at the time a station is selected or periodically based on the signal S28, and stored in a memory unit of the microcomputer 40. Likewise, the reception frequency fr can then be displayed using the stored value f17. Also in this case, it is not necessary to adjust the compensation of the displayed frequency value even if the center frequency f17 of the band-pass filter 17 deviates from the normal value during the process of manufacturing the receiver circuit. At the same time, no discrepancy results in between the reception frequency fr and the displayed frequency value even if the center frequency f17 of the band-pass filter 17 deviates from the normal value due to environmental changes such as variations in temperature.

As an alternative, the value f47 is obtained from the signal S28 and written into non-volatile memory of the microcomputer 40 during the process of manufacturing the receiver circuit. Likewise, the reception frequency fr can then be displayed using the value f17 stored in the non-volatile memory. In addition, the frequency counter 28 can also be added externally to the IC 10 or even embedded in the microcomputer 40 instead of being integrated in the IC 10. Furthermore, even the PLL circuit 30 can also be embedded in the microcomputer 40 or the IC 10 as well.

According to the present invention, the center frequency f17 of the band-pass filter 17 is detected and the detected center frequency f17 is used for correcting the frequency-division ratio N. Accordingly, no discrepancy results in between the reception frequency fr and the displayed frequency value even if the center frequency f17 of the band-pass filter 17 deviates from the normal value.

As a result, transmission from a desired broadcasting station can be normally received without a tuning error even if the broadcasting station is selected in accordance with a frequency displayed in the LCDs 52.

In addition, the value N−f17 displayed to represent the reception frequency fr is always obtained from the values N and f17. Accodingly, it is not necessary to adjust compensation of the displayed frequency value even if the center frequency f17 of the band-pass filter 17 is shifted during the process of manufacturing the receiver circuit. At the same time, no discrepancy results in between the reception frequency fr and the displayed frequency value even if the center frequency f17 of the band-pass filter 17 deviates from the normal value due to environmental changes such as variations in temperature.

An IC 10 was prototyped and a receiver circuit was built by using the prototype of the IC 10. Experiment results indicate that discrepancies between the reception frequency fr and the displayed frequency value are in the range −500 to +500 Hz, fully satisfying the pemissible values of 1 to 1.5 kHz given above.

What is claimed is:

1. A superheterodyne receiver comprising:
a single semiconductor chip embedding at least a mixer circuit, a local-oscillation circuit for generating a local-oscillation signal, a band-pass filter circuit including filter elements and having a center frequency, said band-pass filter circuit serving as an intermediate-frequency filter, a wave detecting circuit, and a pseudo band-pass filter circuit comprising components equivalent to said elements of said intermediate-frequency band-pass filter circuit so as to provide the same passing characteristic and an oscillation circuit including said pseudo band-pass filter circuit in a feedback path connecting the output of said oscillating circuit to the input thereof, said oscillation circuit oscillating at an oscillation frequency equal in value to said center frequency of said intermediate-frequency band-pass filter;
a variable frequency-divider circuit for dividing a local-oscillation frequency of said local-oscillation signal output by said local-oscillation circuit;
a reference oscillation circuit;

a phase-comparing circuit for comparing the phase of a frequency-division output of said variable frequency-divider circuit to the phase of a reference signal output by said reference oscillation circuit;

a low-pass filter for filtering a comparison result output by said phase-comparing circuit;

a display element for displaying a reception frequency;

a PLL circuit formed by supplying an output of said low-pass filter to said local-oscillation circuit as a signal for controlling said local-oscillation frequency thereof;

means for varying a frequency-division ratio of said variable frequency-divider circuit in order to control said reception frequency;

means for monitoring said oscillation frequency of said oscillation circuit; and means for deriving data representing said reception frequency from said monitored oscillation frequency and said frequency-division ratio of said variable frequency-divider circuit and for supplying the derived data to said display element in order to display said reception frequency.

* * * * *